(12) United States Patent
Horiguchi

(10) Patent No.: US 6,660,097 B2
(45) Date of Patent: Dec. 9, 2003

(54) SINGLE-SUBSTRATE-PROCESSING APPARATUS FOR SEMICONDUCTOR PROCESS

(75) Inventor: Takahiro Horiguchi, Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 209 days.

(21) Appl. No.: 09/884,985

(22) Filed: Jun. 21, 2001

(65) Prior Publication Data

US 2001/0054385 A1 Dec. 27, 2001

(30) Foreign Application Priority Data

Jun. 26, 2000 (JP) ........................................ 2000-190594

(51) Int. Cl.⁷ ............................ C23C 16/00; H05H 1/00
(52) U.S. Cl. .................... 118/728; 118/733; 156/345.51
(58) Field of Search .................. 118/728, 725, 118/733, 722, 715; 156/345.51, 345.52, 345.53

(56) References Cited

U.S. PATENT DOCUMENTS

| 3,336,898 A | * | 8/1967 | Simmons et al. ............ 118/720 |
| 5,540,821 A | * | 7/1996 | Tepman .................. 204/192.13 |
| 6,224,934 B1 | * | 5/2001 | Hasei et al. ................... 427/10 |

FOREIGN PATENT DOCUMENTS

| JP | 6-28258 | 4/1994 |
| JP | 10-189490 | 7/1998 |

* cited by examiner

*Primary Examiner*—Parviz Hassanzadeh
(74) *Attorney, Agent, or Firm*—Oblon, Spivak, McClelland, Maier & Neustadt, P.C.

(57) ABSTRACT

A single-substrate-processing apparatus includes an airtight process chamber in which a ceramic worktable is supported by a ceramic pedestal. The bottom of the pedestal is provided with a flange, which is attached to the bottom of the process chamber by a flange holder. The flange holder has upper and lower frames sandwiching the flange therebetween. The flange holder is detachably fixed by fixing bolts to the bottom of the process chamber from outside the process chamber.

23 Claims, 3 Drawing Sheets

SINGLE-SUBSTRATE-PROCESSING APPARATUS FOR SEMICONDUCTOR PROCESS

CROSS-REFERENCE TO RELATED APPLICATIONS

This application is based upon and claims the benefit of priority from the prior Japanese Patent Application No. 2000-190594, filed Jun. 26, 2000, the entire contents of which are incorporated herein by reference.

BACKGROUND OF THE INVENTION

The present invention relates to a single-substrate-processing apparatus for performing a semiconductor process, such as oxidation, diffusion, film formation, or annealing. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

In the process of manufacturing semiconductor devices, several types of heat-processing apparatuses are used for subjecting target substrates, such as semiconductor wafers, to a semiconductor process, such as oxidation, diffusion, film formation, or annealing. A single-substrate-processing apparatus, which handles wafers one by one, is known as one of these heat-processing apparatuses. The single-substrate-processing apparatus generally includes an airtight process chamber, and a worktable disposed in the process chamber for mounting a target substrate.

Jpn. Pat. Appln. KOUKOKU Publication No. 6-28258 and Jpn. Pat. Appln. KOKAI Publication No. 10-189490 disclose a structure in which a ceramic worktable with a built-in resistance heater is supported by a ceramic pedestal. Since the worktable and the pedestal are made of a ceramic, they can provide a heat source, which withstands a high temperature of, e.g., 500° C. or more, while not contaminating a target substrate, such as a wafer.

However, the present inventors have found that the structure described above causes the following problems in relation to the installation of the worktable in the process chamber. First, ceramics do not have a high mechanical strength, and thus connected portions of the pedestal tend to break easily. In addition, when the pedestal is attached to or detached from the process chamber, the worktable is an obstacle to the operation, thereby deteriorating ease of use.

BRIEF SUMMARY OF THE INVENTION

An object of the present invention is to provide a single-substrate-processing apparatus for a semiconductor process, which allows a worktable to be installed in a process chamber with a high mechanical strength, and also allows the worktable to be easily attached and detached.

According to a first aspect of the present invention, there is provided a single-substrate-processing apparatus for performing a semiconductor process, comprising:

an airtight process chamber;

a supply section configured to supply a process gas into the process chamber;

an exhaust section configured to vacuum-exhaust the process chamber;

a worktable having a mount face configured to horizontally support a target substrate within the process chamber, the worktable having a table body consisting essentially of a ceramic;

a heater configured to heat the target substrate through the mount face, the heater comprising a resistance heater embedded in the table body;

a pedestal configured to stand upright in the process chamber and support the worktable, the pedestal having a pedestal body consisting essentially of a ceramic, and the pedestal body having a flange at a bottom end;

a flange holder configured to attach the flange to a bottom of the process chamber, the flange holder comprising an upper frame that pushes the flange toward the bottom of the process chamber; and a fixing member configured to detachably fix the flange holder to the bottom of the process chamber from outside the process chamber, the fixing member penetrating the bottom of the process chamber and engaging with the flange holder.

According to a second aspect of the present invention, there is provided a single-substrate-processing apparatus for performing a semiconductor process, comprising:

an airtight process chamber having a bottom provided with an opening formed therein, a supply section configured to supply a process gas into the process chamber;

an exhaust section configured to vacuum-exhaust the process chamber;

a worktable having a mount face configured to horizontally support a target substrate within the process chamber, the worktable having a table body consisting essentially of a ceramic;

a heater configured to heat the target substrate through the mount face, the heater comprising a resistance heater embedded in the table body;

a pedestal configured to stand upright in the process chamber and support the worktable, the pedestal extending from the worktable to the bottom of the process chamber and having an internal hollow portion communicating with the opening, the pedestal having a pedestal body consisting essentially of a ceramic, and the pedestal body having a flange at a bottom end;

an electrical cable connected to the resistance heater and led out to an outside of the process chamber through the internal hollow portion and the opening;

a flange holder configured to attach the flange to a bottom of the process chamber, the flange holder comprising an upper frame that pushes the flange toward the bottom of the process chamber, and a lower frame disposed between the upper frame and the bottom of the process chamber, such that the flange is sandwiched between the upper and lower frames, and the upper frame comprising a plurality of parts separated from each other by radial separating lines; and a fixing member configured to detachably fix the flange holder to the bottom of the process chamber from outside the process chamber, the fixing member penetrating the bottom of the process chamber and engaging with the flange holder, the fixing member comprising a plurality of fixing bolts, and the flange holder having a plurality of female thread portions that respectively engage with the fixing bolts.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
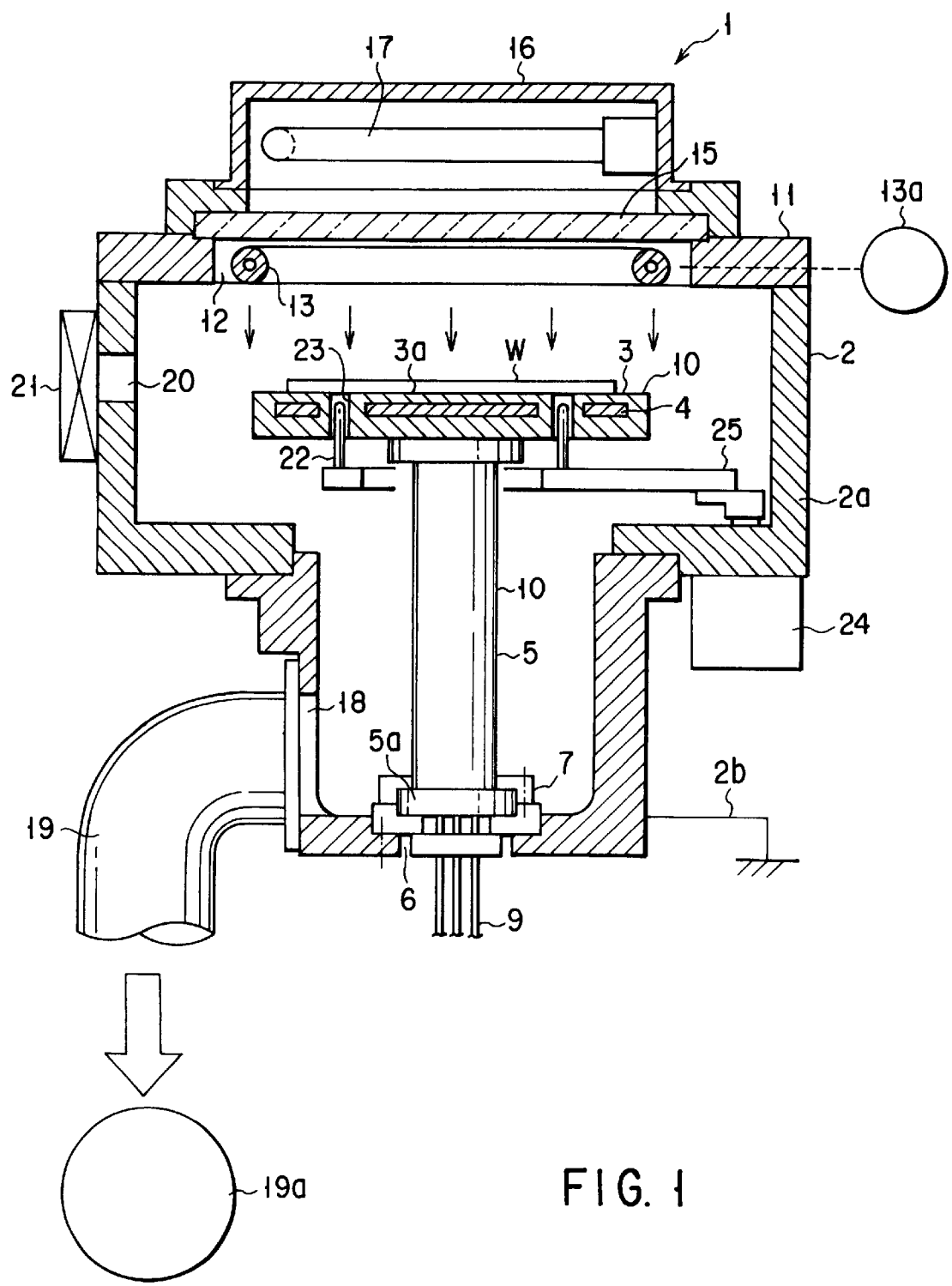
FIG. 1 is a schematic sectional view showing a single-substrate-processing apparatus according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a schematic sectional view showing a single-substrate-processing apparatus according to an embodiment of the present invention. This apparatus 1 is constituted as a single-substrate-processing apparatus for subjecting semiconductor wafers, i.e., target substrates, to oxidation one by one.

The single-substrate-processing apparatus 1 includes a process chamber 2 defined by a casing 2a made of a heat resistant material, such as a metal, preferably, aluminum. The inner surface of the casing 2a has been subjected to a surface treatment, such as an anodic oxidation treatment, to provide the surface with a corrosion resistance relative to a process gas, and to prevent metal contamination to a wafer. The core of the casing 2a is conductive, and is grounded by a ground line 2b.

In the process chamber 2, there is a circular worktable (susceptor) 3 having a circular mount face 3a, on which the wafer W is mounted. The worktable 3 has a table body as a main body consisting essentially of a material, which is heat resistant, electrically insulating, and non-contaminating to the wafer W, such as a sintered ceramic selected from the group consisting of sintered aluminum nitride (AlN), silicon carbide (SiC), and silicon nitride (SiN). A resistance heater 4 for heating the wafer W through the worktable 3 is horizontally disposed and embedded in the worktable 3. As a result, the worktable 3 constitutes a so-called ceramic heater, which is clean without any metal contaminant relative to the wafer W. The resistance heater 4 is controlled by a controller (not shown), so that the wafer W on the worktable 3 is heated to a predetermined temperature.

The worktable 3 is integratedly arranged on the top of a pedestal 5, which is disposed on the bottom of the casing 2a of the processing chamber 2 to stand upright. Similarly to the worktable 3, the pedestal 5 has a pedestal body as a main body consisting essentially of a material, which is heat resistant, electrically insulating, and non-contaminating to the wafer W, such as a sintered ceramic selected from the group consisting of AlN, SiC, and SiN. The pedestal 5 is formed of a hollow circular column or cylinder. Electrical cables 9 for the resistance heater 4 and a thermo-sensor, such as a thermocouple, (not shown) disposed in the worktable 3 are led out of the process chamber 2 through the hollow portion of the pedestal 5 and a bottom opening 6 of the process chamber 2. The bottom of the pedestal 5 is provided with a flange 5a, which is held by a metal flange holder 7 and fixed to the bottom of the process chamber 2, as described later.

The casing 2a of the process chamber 2 is constituted of upper and lower casing parts, which are detachably jointed at a position close to the middle in the vertical direction. The upper casing part, in which the worktable 3 is disposed, has a diameter larger than that of the lower casing part, in which the pedestal 5 is disposed. The casing 2a of the process chamber 2 has a ceiling, which is formed of an openable or detachable lid 11. The lid 11 has an opening 12 having a size larger than that of the worktable 3 at a position opposite to the worktable 3. A ring showerhead 13 made of quartz is disposed near the opening 12, and is connected to a gas supply section 13a for supplying a process gas containing an oxidizing gas, such as ozone ($O_3$). The showerhead 13 is provided with a number of gas spouting holes, which are formed at the bottom to spout a process gas, such as ozone, toward the wafer W on the worktable 3.

A transmission window 15, which is made of quartz and is transparent to ultraviolet (UV) rays, is airtightly attached to the upper portion of the lid 11 and covers the opening 12. A lamp chamber 16 is formed on the transmission window 16, and accommodates a plurality of UV lamps 17 facing the transmission window 15. UV rays emitted from the UV lamps 17 are transmitted through the window 15 and radiated onto the ozone gas supplied from the showerhead 13 in the space above the worktable 3. Consequently, the ozone is decomposed into oxygen ($O_2$) and oxygen radicals ($o^+$), which are then supplied onto the surface of the wafer W.

An exhaust port 18 is formed in the sidewall of the casing 2a of the process chamber 2 near the bottom. The exhaust port 18 is connected through an exhaust line 19 to an exhaust section 19a, which includes a pressure-reducing pump and a pressure controller for vacuum-exhausting the process chamber 2 and setting it at certain pressures. A transfer port 20 is formed in the sidewall of the casing 2a of the process chamber 2 near the top, for transferring the wafer W into and out of the process chamber 2 by an outer transfer arm (not shown). The port 20 is provided with a gate valve 21, which is airtightly closed and opened.

A plurality of, e.g., three, lifer pins 22 are disposed in the worktable 3, for transferring the wafer W between the outer transfer arm and the worktable 3. The lifter pins 22 project and retreat relative to the mount face 3a through respective lifter holes 23 formed through the worktable 3, so that they engage with the bottom surface of the wafer W. The lifter pins 22 are moved up and down by a driving section 24, such as an air cylinder, which is disposed outside the process chamber 2 and connected to the lifter pins 22 through a common elevating arm 25.

Where the worktable 3 and the pedestal 5 have electrically insulating surfaces, they tend to be charged with static electricity due to ions and electrons generated by the UV ray irradiation during a process. In this case, a conductive film 10 is preferably formed on the insulating surfaces of the worktable 3 and the pedestal 5 to conduct static electricity generated on the worktable 3 to a grounded portion outside the process chamber 2. The conductive film 10 may consists of a conductive ceramic containing no metal elements, such as silicon carbide (SiC), which is formed by means of CVD (Chemical Vapor Deposition).

That portion of the casing 2a of the process chamber 2, which is in contact with the pedestal 5 through the metal flange holder 7, has no anodized aluminum surface, i.e., has not been subjected to an anodic oxidation treatment, but has an exposed conductive surface. The exposed conductive surface of the casing 2a of the process chamber 2 comes in direct contact with the metal flange holder 7, so that a conductive passage for static electricity is ensured from the conductive film 10 through the core of the casing 2a to the ground line 2b.

The mount face 3a may be provided with a guide ring, positioning pins, or a recess, to suppress or prevent the wafer W from causing a large positional shift or falling down therefrom due to a transfer error or vibration. For example, although the wafer W may be displaced from the normal position due to the accuracy of an outer transfer arm (not shown) and so forth, the guide rind or the like allows the wafer W to stay near the normal position.

Figure 2:
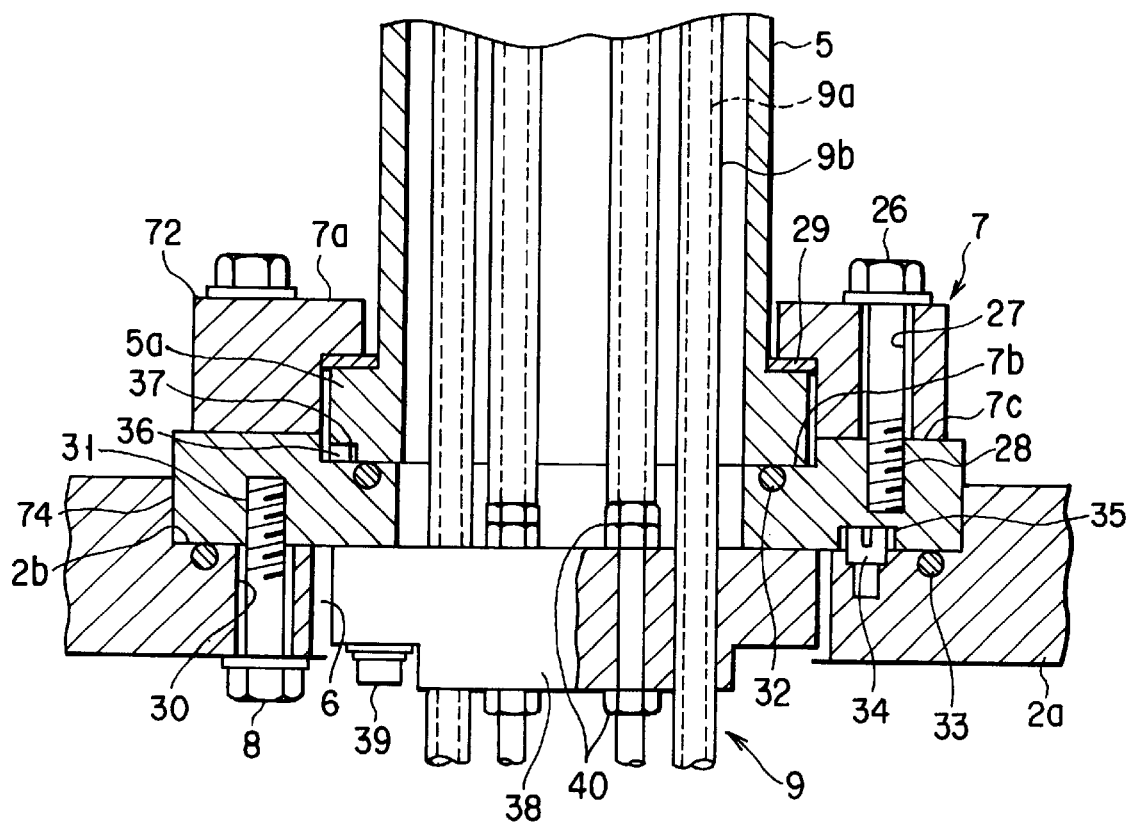
FIG. 2 is an enlarged sectional view showing the connected portion of a pedestal for a worktable relative to the bottom of a process chamber, adopted in the apparatus shown in FIG. 1.
Figure 3:
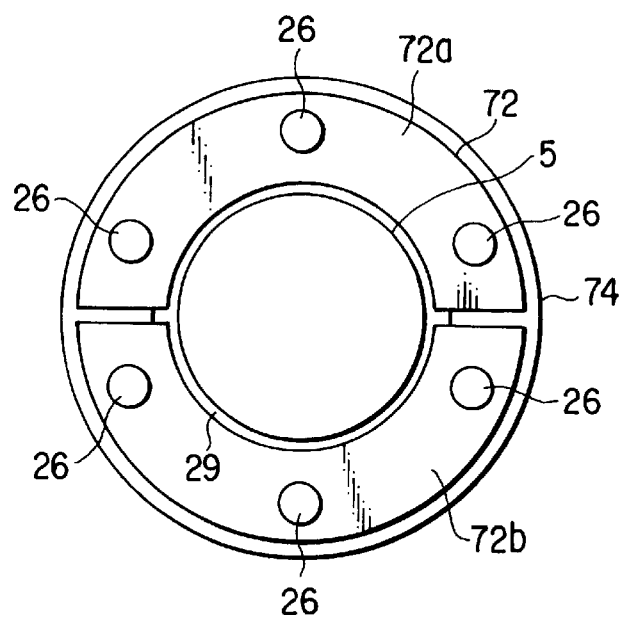
FIG. 3 is a plan view showing the connected portion shown in FIG. 2.

FIG. 2 is an enlarged sectional view showing the connected portion of the pedestal 5 for the worktable 3 relative to the bottom of the process chamber 2, adopted in the apparatus shown in FIG. 1. FIG. 3 is a plan view showing the connected portion shown in FIG. 2.

The flange holder 7 is arranged to detachably connect the pedestal 5 for the worktable 3 to the bottom of the casing 2a of the process chamber 2, so that the pedestal 5 stands upright. The flange holder 7 is detachably fixed by a plurality of, e.g., four, fixing members, such as fixing bolts 8, from the outside of the bottom of the process chamber 2.

The flange holder 7 is formed of an upper ring frame 72 for pushing the flange 5a toward the bottom of the process chamber 2, and a lower ring frame 74 disposed between the upper frame 72 and the bottom of the process chamber 2. The ring flange 5a is sandwiched and fixed between the upper and lower frames 72 and 74. The upper frame 72 consists of a plurality of, e.g., two, parts 72a and 72b, which are separated by radial separating lines.

The upper and lower frames 72 and 74 are detachably connected to each other by a plurality of, e.g., four, connecting members, such as connecting bolts 26. The upper frame 72 has through holes 27 for respectively inserting the connecting bolts 26 from above, and the lower frame 74 has female thread portions 28 for respectively engaging with the connecting bolts 26. The upper and lower frames 72 and 74 are made of aluminum having anodized aluminum surface. However, as described above, no anodized aluminum surfaces are formed at the portions used for the conductive passage for static electricity, such as a surface 7b of the lower frame 74 described later. The upper and lower frames 72 and 74 may be made of a metal selected from the group consisting of stainless steel, Ni, Ta, Zi, Ti, other than Al.

The upper frame 72 has a ring shape surrounding the flange 5a. The upper frame 72 is provided with an overhang 7a integrally formed therewith at the upper side of the inner periphery, for pressing the top surface of the flange 5a. As shown in FIG. 3, the upper frame 72 consists of a plurality of, e.g., two, parts 72a and 72b, which are separated by radial separating lines, in order for the upper frame 72 to be easily detached from the pedestal 5. A cushion ring member 29 made of a material, which is heat-resistant, corrosion-resistant, and elastic, such as Teflon (TM), is interposed between the overhang 7a of the upper frame 72 and the top surface of the flange 5a.

The lower frame 74 has a ring shape with a diameter the same as or slightly larger than that of the upper frame 72. The lower frame 74 has inner and outer contact surfaces 7b and 7c, which are disposed concentrically with each other, and come into contact with the bottom surfaces of the flange 5a and the upper frame 72, respectively. The inner contact surface 7b is formed as a recess for positioning the flange 5a.

The upper surface of the bottom of the process chamber 2 is provided with a contact surface 2b, which is disposed concentrically with the opening 6, and comes into contact with the bottom surface of the lower frame 74. The inner contact surface 2b is formed as a recess for positioning the lower frame 74. The bottom of the process chamber 2 has through holes 30 for respectively inserting the fixing bolts 8 from the outside thereunder, and the lower frame 74 has female thread portions 31 for respectively engaging with the fixing bolts 8.

The fixing bolts 8 and the connecting bolts 26 are disposed outside the plan-view contour of the flange 5a, so that they do not come into contact with the flange 5a of the pedestal 5. In the lower frame 74, the female thread portions 28 are arranged not to communicate with the female thread portions 31, so that the process chamber 2 is prevented from losing the airtightness.

Furthermore, in order to ensure that the process chamber 2 is airtight, a seal member for airtight seal, such as an O-ring 32 made of, e.g., Teflon (TM), is disposed between the inner contact surface 7b of the lower frame 74 and the bottom surface of the flange 5a. Similarly, a seal member for airtight seal, such as an O-ring 33 made of, e.g., Teflon (TM), is disposed between the bottom contact surface 2b of the process chamber 2 and the bottom surface of the lower frame 74.

In order to position the worktable 3 in the angular direction, the contact surface 2b on the bottom of the process chamber 2 is provided with a projecting portion 34, and the bottom surface of the lower frame 74 is provided with a recess portion 35 to engage with the projecting portion 34. Similarly, the inner contact surface 7b of the lower frame 74 is provided with a projecting portion 36, and the bottom surface of the flange 5a is provided with a recess portion 37 to engage with the projecting portion 36.

A support plate 38 made of an insulating material, such as a ceramic, for supporting the electrical cables 9 is attached by screws 39 to the bottom of the lower frame 74. Each of the electrical cables 9 comprises a conductor rod 9a, which is wrapped in a woven member 9b made of a heat-resistant and insulating material, such as Teflon (TM). As shown in FIG. 2, only the conductive rod 9a of an electrical cable 9 may be inserted through a hole in the support plate 38 and fixed by a nut 40.

An oxidation process is performed in the single-substrate-processing apparatus 1, as follows:

First, the gate valve 21 of the port 20 is opened, and a wafer W is transferred into the process chamber 2 by the outer transfer arm. The lifter pins 22 are moved up to receive the wafer W from the outer transfer arm. Then, the lifter pins 22 are moved down to place the wafer W on the top of the worktable 2. After the outer transfer arm retreats out of the process chamber 2, the gate valve 21 is closed.

Then, the wafer W is heated to a predetermined process temperature by the resistance heater 4 disposed in the worktable 3. The process chamber 2 is supplied with ozone gas, i.e., a process gas, while the process chamber 2 is exhausted, so that the interior of the process chamber 2 is kept at a predetermined process pressure. The ozone gas is spouted from the holes of the showerhead 13 toward the wafer W on the worktable 3. At the same time, the UV lamps 17 in the lamp chamber 16 are turned on to emit UV rays. The UV rays are transmitted through the window 15 and radiated onto the process gas containing ozone as the main component, above the worktable 3 in the process chamber 2. The ozone is decomposed into oxygen and oxygen radicals, due to irradiation with the UV rays. The wafer W on the worktable 3 is subjected to a predetermined process, i.e., oxidation, with the oxygen radicals.

An operation of installing the worktable 3 is performed in the single-substrate-processing apparatus 1, as follows:

Before the worktable 3 is installed in the process chamber 2, the flange holder 7 is attached to the flange 5a of the pedestal 5, such that the upper and lower frames 72 and 74 of the flange holder 7 sandwich the flange 5a therebetween and are connected to each other. Then, the worktable 3 is carried from above into the process chamber 2, which has an opening from which the lid 11 is detached, so that the lower frame 74 is brought into contact with the contact surface 2b on the bottom of the process chamber 2. Then, the lower frame 74 is fixed by the fixing bolts 8, which penetrate the bottom of the process chamber 2 from below. With this operation, the worktable 3 is easily installed in the process chamber 2, using the flange holder 7.

The flange 5a is not directly fixed by the fixing bolts 8, but is indirectly fixed by the fixing bolts 8 through the flange holder 7. Accordingly, the flange 5a is prevented from being damaged due to a locally concentrated stress. In addition, since the cushion member 29 is interposed between the flange 5a and the flange holder 7, it is further ensured that the flange 5a is prevented from being damaged. Where the worktable 3 is removed from the process chamber 2, the operation is performed in the order reverse to the above-described operation, whereby the worktable 3 is removed.

Figure 4:
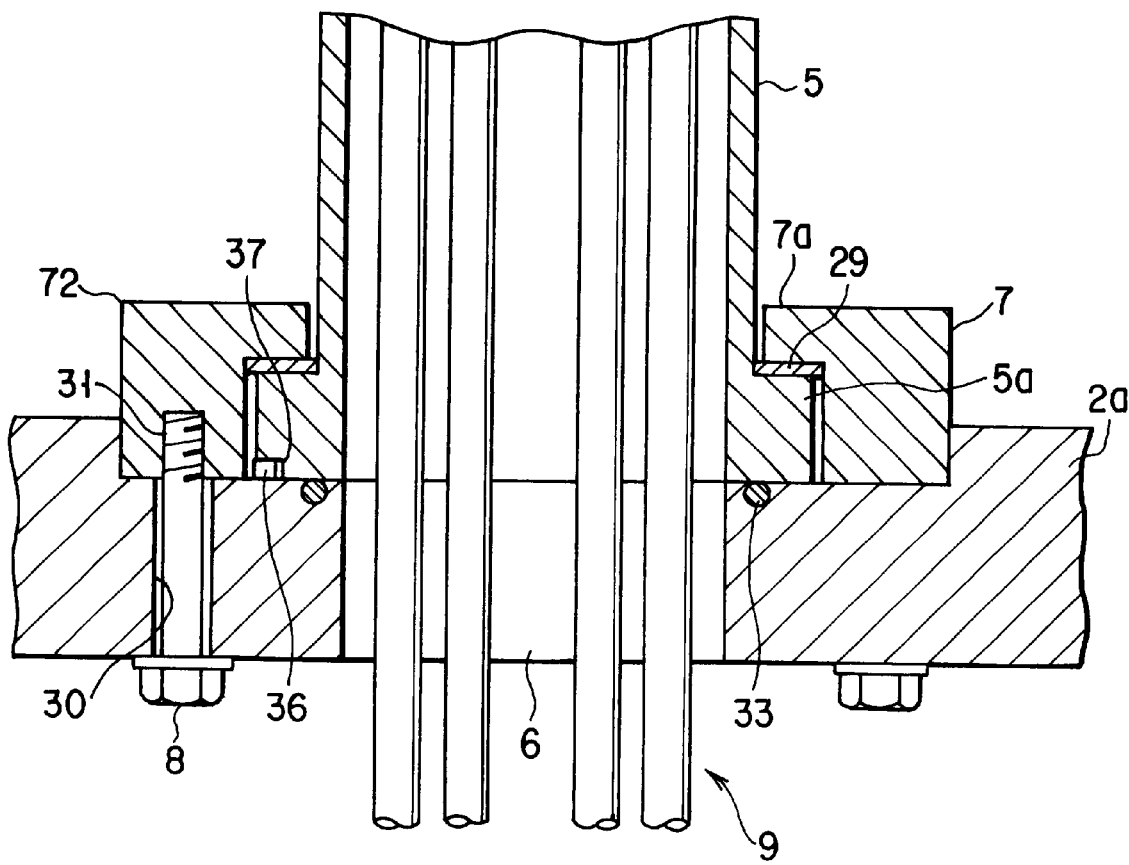
FIG. 4 is an enlarged sectional view showing the connected portion of a pedestal for a worktable relative to the bottom of a process chamber, adopted in a single-substrate-processing apparatus according to another embodiment of the present invention.

FIG. 4 is an enlarged sectional view showing the connected portion of a pedestal for a worktable relative to the bottom of a process chamber, adopted in a single-substrate-processing apparatus according to another embodiment of the present invention.

The embodiment shown in FIG. 4 employs a flange holder 7 having an upper frame 7 only. Accordingly, the flange holder 7 does not have though holes for connecting bolts, but has female thread portions 31 for fixing bolts 8. In this embodiment, when the worktable 3 is installed in the process chamber 2, the flange holder 7 is placed on the flange 5a of a pedestal 5, and is brought into contact with the inside of the bottom of the process chamber 2. Then, the flange holder 7 is fixed by the fixing bolts 8, which penetrate the bottom of the process chamber 2 from below. According to this embodiment, functions and effects similar to those of the embodiment shown in FIG. 2 are obtained, while the number of parts is reduced.

In each of the embodiments shown in FIGS. 2 and 4, a member other than bolts or screws, such as a clamp, may be used, in order to detachably fix the flange holder 7 from the outside under the bottom of the process chamber 2. The present invention may be applied to a processing apparatus, other than an oxidizing apparatus, such as a diffusing, film forming, etching, or annealing apparatus. Furthermore, the present invention may be applied to a target substrate other than a semiconductor wafer, such as an LCD substrate, or a glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A single-substrate-processing apparatus for performing a semiconductor process, comprising:
   an airtight process chamber configured to process a target substrate therein;
   a worktable having a mount face configured to support the target substrate within the process chamber;
   a hollow pedestal configured to support the worktable and having a flange at a bottom end;
   a flange holder having an overhang configured to cover the flange from above within the process chamber; and
   a fixing member configured to detachably fix the pedestal to a bottom of the process chamber by engaging with the flange holder from below and outside the bottom of the process chamber, the fixing member providing the overhang of the flange holder with a force to push the flange toward the bottom of the process chamber.

2. The apparatus according to claim 1, wherein the fixing member comprises a plurality of fixing bolts, and the flange holder has a plurality of female thread portions that respectively engage with the fixing bolts.

3. The apparatus according to claim 2, wherein the fixing bolts are disposed outside a plan-view contour of the flange, and do not come into contact with the flange.

4. The apparatus according to claim 1, wherein the overhang comprises a plurality of parts separated from each other by radial separating lines.

5. The apparatus according to claim 1, wherein a cushion member is interposed between the flange and the overhang.

6. The apparatus according to claim 1, wherein a combination of a projecting portion and a recess portion are disposed between the flange holder and the bottom of the process chamber for positioning in an angular direction therebetween.

7. The apparatus according to claim 1, wherein the flange holder consists essentially of a metal selected from the group consisting of Al, Ni, Ta, Zi, Ti, and stainless steel.

8. The apparatus according to claim 1, wherein the bottom of the process chamber is provided with an opening formed therein, the pedestal has an internal hollow portion extending from the worktable to the bottom of the process chamber and communicating with the opening, and an electrical cable is led out to an outside of the process chamber through the internal hollow portion and the opening.

9. The apparatus according to claim 8, wherein a seal member is disposed between the flange holder or the flange and the bottom of the process chamber, such that the process chamber is airtightly sealed.

10. The apparatus according to claim 1, wherein the pedestal has a pedestal body consisting essentially of a ceramic, and the pedestal body has the flange at a bottom end.

11. A single-substrate-processing apparatus for performing a semiconductor process, comprising:

an airtight process chamber configured to process a target substrate therein;

a worktable having a mount face configured to support the target substrate within the process chamber;

a hollow pedestal configured to support the worktable and having a flange at a bottom end;

a flange holder comprising an upper frame having an overhang configured to cover the flange from above within the process chamber, and a lower frame having a ring seat configured to cover the flange from below within the process chamber;

a connecting member configured to connect the upper and lower frames to each other with the flange sandwiched between the overhang and the seat; and a fixing member configured to detachably fix the pedestal to a bottom of the process chamber by engaging with the lower frame from below and outside the bottom of the process chamber.

12. The apparatus according to claim 11, wherein the fixing member comprises a plurality of fixing bolts, and the flange holder has a plurality of female thread portions that respectively engage with the fixing bolts.

13. The apparatus according to claim 12, wherein the fixing bolts are disposed outside a plan-view contour of the flange, and do not come into contact with the flange.

14. The apparatus according to claim 11, wherein the upper frame comprises a plurality of parts separated from each other by radial separating lines.

15. The apparatus according to claim 11, wherein a cushion member is interposed between the flange and the upper frame.

16. The apparatus according to claim 11, wherein a combination of a projecting portion and a recess portion are disposed between the flange holder and the bottom of the process chamber for positioning in an angular direction therebetween.

17. The apparatus according to claim 11, wherein the flange holder consists essentially of a metal selected from the group consisting of Al, Ni, Ta, Zi, Ti, and stainless steel.

18. The apparatus according to claim 11, wherein the upper and lower frames are detachably connected to each other by the connecting member.

19. The apparatus according to claim 18, wherein the connecting member comprises a plurality of connecting bolts, the upper frame has through holes in which the connecting bolts are respectively inserted, and the lower frame has a plurality of female thread portions that respectively engage with the connecting bolts.

20. The apparatus according to claim 18, wherein a combination of a projecting portion and a recess portion are disposed between the upper and lower frames for positioning in an angular direction therebetween.

21. The apparatus according to claim 11, wherein the bottom of the process chamber is provided with an opening formed therein, the pedestal has an internal hollow portion extending from the worktable to the bottom of the process chamber and communicating with the opening, and an electrical cable is led out to an outside of the process chamber through the internal hollow portion and the opening.

22. The apparatus according to claim 21, wherein a seal member is disposed between the flange holder or the flange and the bottom of the process chamber, such that the process chamber is airtightly sealed.

23. The apparatus according to claim 11, wherein the pedestal has a pedestal body consisting essentially of a ceramic, and the pedestal body has the flange at a bottom end.

* * * * *